US 6,489,238 B1

(12) United States Patent
Tsui

(10) Patent No.: US 6,489,238 B1
(45) Date of Patent: Dec. 3, 2002

(54) METHOD TO REDUCE PHOTORESIST CONTAMINATION FROM SILICON CARBIDE FILMS

(75) Inventor: Ting Yiu Tsui, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/934,186

(22) Filed: Aug. 21, 2001

(51) Int. Cl.[7] .............................................. H01L 21/44
(52) U.S. Cl. ...................... 438/676; 438/680; 438/681
(58) Field of Search ................................ 118/620, 715, 118/720, 723 MW; 438/149, 483, 597, 622, 641, 676, 680, 681, 761, 942

(56) References Cited

U.S. PATENT DOCUMENTS 4,847,215 A * 7/1989 Hanaki et al. .............. 438/483
6,349,669 B1 * 2/2002 Matsumura et al. .. 118/723 HC
6,365,527 B1 * 4/2002 Yang et al. ................. 438/761
6,383,907 B1 * 5/2002 Hasegawa et al. .......... 438/597

* cited by examiner

Primary Examiner—Michael Sherry
Assistant Examiner—Asok Kumar Sarkar
(74) Attorney, Agent, or Firm—Peter K. McLarty; W. James Brady III; Frederick J. Telecky, Jr.

(57) ABSTRACT

Silicon carbide layers are often used as hardmask layers in semiconductor processing. The photoresist used to pattern the silicon carbide layers during the hardmask patterning process can become poisoned by the silicon carbide layer and remain attached to the silicon carbide surface. According to the method of the instant invention a trimethylsilane and oxygen treatment of the silicon carbide growth chamber prior to layer growth will reduce the photoresist poisoning.

12 Claims, 1 Drawing Sheet

METHOD TO REDUCE PHOTORESIST CONTAMINATION FROM SILICON CARBIDE FILMS

FIELD OF THE INVENTION

The invention is generally related to the field of semiconductor devices and fabrication and more specifically to a method for reducing photoresist contamination from silicon carbide films.

BACKGROUND OF THE INVENTION

To increase the operating speed, high performance integrated circuits use copper interconnect technology along with low dielectric constant dielectrics. Currently the damascene method is the most widely used method for forming copper interconnects. In the damascene method trenches are first formed in dielectric layers above the silicon wafer. The trenches are then filled with copper which form the electrical interconnects between the electronic devices which comprise the integrated circuit. In most instances it is beneficial to use a hardmask when etching the trenches required for the damascene method. This is illustrated in FIGS. 1(a)–1(b).

Shown in FIG. 1(a) is a dielectric layer 10 on which a hardmask layer 20 was formed. A photoresist layer 30 was formed and patterned on the hardmask layer 20 and used as a mask to etch an opening 35 in the hardmask layer 20 as shown in FIG. 1(a). Following the removal of the photoresist layer 30, the hardmask layer 20 is used as a mask to etch a trench in the dielectric layer 10 as shown in FIG. 1(b). A major drawback to the use of hardmasks however is resist contamination or resist poisoning (hereafter referred to as resist poisoning). An example of resisting poisoning is shown in FIGS. 2(a) and 2(b).

As shown in FIG. 2(a) a patterned photoresist layer 50 is formed over a hardmask layer 40 and a dielectric layer 10. Due to resist poisoning, the width of the exposed pattern in the photoresist layer 52 is greater that the width of the pattern transferred to the hardmask 54. This difference is due to the poisoning of the photoresist close to the hardmask layer. As a result of the resist poisoning effect, the width of the trench in the dielectric layer 54 will be less than the desired trench width 52. This distortion of trench width can result in a degradation in the performance of the integrated circuit. There is therefore a need for a method that reduces and/or eliminates photoresist poisoning.

SUMMARY OF THE INVENTION

The instant invention describes a method to reduce photoresist poisoning from silicon carbide layers. In particular the method comprises performing a deposition chamber pre-coat process comprising trimethylsilane and oxygen prior to silicon carbide layer formation. The silicon carbide layer is formed on a dielectric layer using a deposition process comprising trimethylsilane. Following the formation of the silicon carbide hardmask layer, a patterned photoresist layer is formed on the silicon carbide layer; and the silicon carbide layer is patterned using the patterned photoresist layer as a mask.

DETAILED DESCRIPTION OF THE INVENTION

The invention will now be described with reference to FIG. 3. It will be apparent to those of ordinary skill in the art that the benefits of the invention can be applied to other structures where a patterned hardmask is required.

Figure 1A:
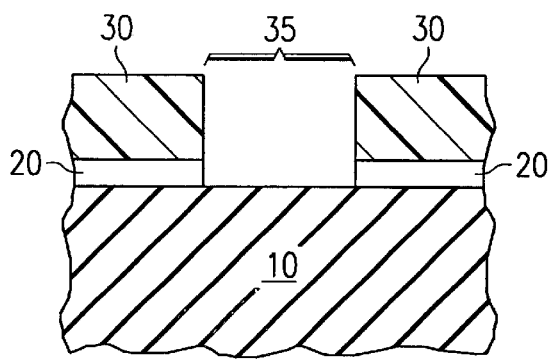
FIGS. 1(a)–1(b) are cross-sectional diagrams illustrating the prior art.
Figure 1B:
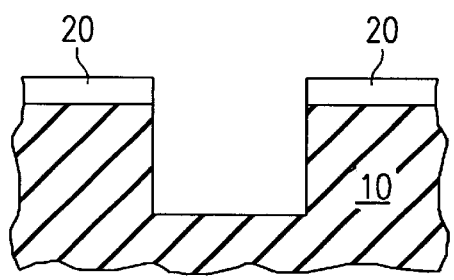
Figure 2A:
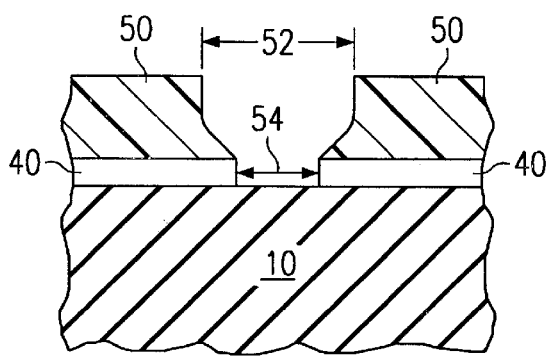
FIGS. 2(a)–2(b) are cross-sectional diagrams illustrating the effect of photoresist poisoning according to the prior art.
Figure 2B:
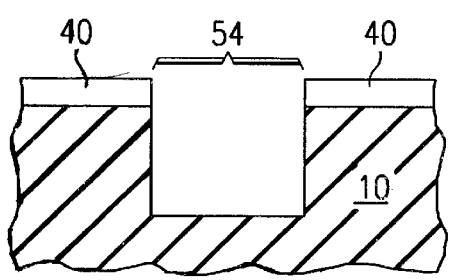
Figure 3A:
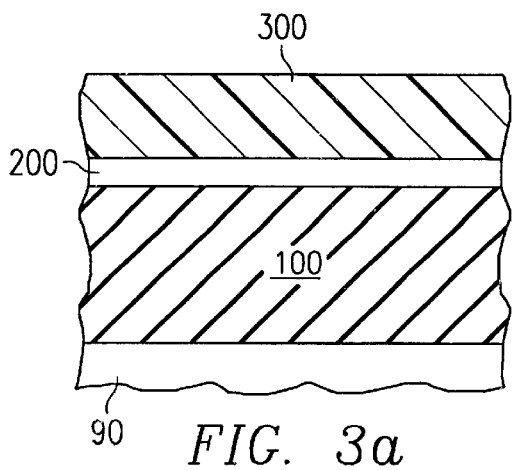
FIGS. 3(a)–3(b) are cross-sectional diagrams illustrating an embodiment of the instant invention.

As shown in FIG. 3(a), a dielectric layer 100 is formed over a silicon substrate 90 containing electronic devices such as transistors, diodes, etc. The dielectric layer 100 can comprise silicon oxide or any suitable dielectric material. A hardmask layer 200 is formed on the dielectric layer 100 in a deposition chamber according to the instant invention. In an embodiment of the instant invention the hardmask layer 200 will comprise silicon carbide. The silicon carbide hardmask layer 200 can be formed using a plasma enhanced chemical vapor deposition (PECVD) process of trimethylsilane and helium. In particular about 280–350 SCCM of trimethylsilane and 600–1000 SCCM of helium can be flowed in the deposition chamber with a plasma RF power of about 360–500 Watts and a silicon substrate temperature of about 200–500° C. This deposition process can be followed by a plasma helium treatment using a RF power of about 150–350 Watts. Prior to the PECVD process used to form the silicon carbide hardmask layer 200, a deposition chamber pre-coat process is performed. This deposition chamber pre-coat process is required to stabilize the walls of the deposition chamber before the actual silicon carbide layer deposition and reduces the amount of nitrogen incorporated into the surface of the silicon carbide hardmask layer 200 during the plasma helium treatment. The deposition chamber pre-coat process comprises a plasma process comprising trimethylsilane and oxygen. In an embodiment of the instant invention the deposition chamber pre-coat process comprises gas flow rates of about 200–550 SCCM of trimethylsilane and about 100–250 SCCM of oxygen with a plasma RF power level of 400–500 Watts. As stated above the chamber pre-coat process reduces the amount of nitrogen incorporated into the surface of the silicon carbide layer 200 during its formation. This reduced nitrogen concentration reduces the poisoning of photoresist layers that are formed on the silicon carbide layer 200.

Figure 3B:
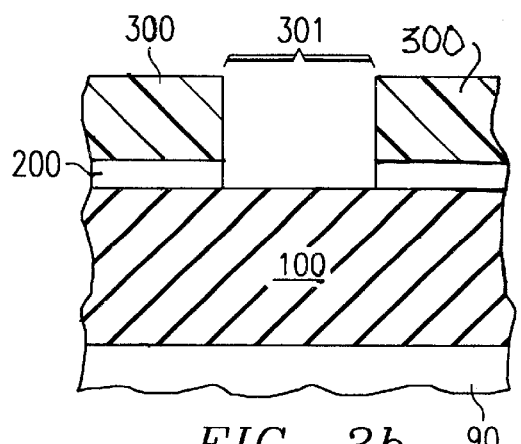

Following the formation of the silicon carbide layer 200, a photoresist layer 300 is formed on the silicon carbide layer as shown in FIG. 3(a) using standard semiconductor processing technology. The photoresist layer will be patterned and used to transfer the pattern to the silicon carbide hardmask layer 200. This is illustrated in FIG. 3(b) where the patterned photoresist film was used as a mask to transfer the pattern 301 into the silicon carbide film 200. The patterned silicon carbide film can now be used as a hardmask during the etching of the dielectric layer 100.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method for forming silicon carbide layers, comprising:

providing a deposition chamber;

providing a dielectric layer on a silicon substrate;

performing a deposition chamber pre-coat process comprising trimethylsilane and oxygen; and forming a silicon carbide layer on said dielectric layer with a deposition process comprising trimethylsilane.

2. The method of claim 1 wherein said deposition chamber pre-coat process further comprises a RF plasma power of 400–500 Watts.

3. The method of claim 1 wherein said silicon carbide deposition process further comprises a RF plasma power of 360–500 Watts.

4. The method of claim 3 further comprising a plasma helium treatment using a RF power of 150–350 Watts.

5. A method for forming silicon carbide hardmask layers, comprising:

providing a deposition chamber;

providing a dielectric layer on a silicon substrate;

performing a deposition chamber pre-coat process comprising trimethylsilane and oxygen;

forming a silicon carbide layer on said dielectric layer with a deposition process comprising trimethylsilane; and exposing said silicon carbide layer to a helium plasma process.

6. The method of claim 5 wherein said helium plasma process comprises a plasma RF power of 150–350 Watts.

7. The method of claim 5 wherein said deposition chamber pre-coat process further comprises a RF plasma power of 400–500 Watts.

8. The method of claim 6 wherein said silicon carbide deposition process further comprises a RF plasma power of 360–500 Watts.

9. A method for forming a patterned silicon carbide hardmask, comprising:

providing a deposition chamber;

providing a dielectric layer on a silicon substrate;

performing a deposition chamber pre-coat process comprising trimethylsilane and oxygen;

forming a silicon carbide layer on said dielectric layer with a deposition process comprising trimethylsilane;

forming a patterned photoresist layer on said silicon carbide layer; and patterning said silicon carbide layer using said patterned photoresist layer as a mask.

10. The method of claim 9 wherein said deposition chamber pre-coat process further comprises a RF plasma power of 400–500 Watts.

11. The method of claim 9 wherein said silicon carbide deposition process further comprises a RF plasma power of 360–500 Watts.

12. The method of claim 9 further comprising a plasma treatment using a RF power of 150–350 Watts.

* * * * *